(12) United States Patent
Battiston et al.

(10) Patent No.: US 11,323,012 B2
(45) Date of Patent: May 3, 2022

(54) FLOW-COOLED POWER ELECTRONICS

(71) Applicant: IFP Energies nouvelles, Rueil-Malmaison (FR)

(72) Inventors: Alexandre Battiston, Rueil-Malmaison (FR); Laid Kefsi, Garches (FR); Fabrice Le Berr, Rueil-Malmaison (FR)

(73) Assignee: IFP ENERGIES NOUVELLES, Rueil-Malmaison (FR)

( * ) Notice: Subject to any disclaimer, the term of this patent is extended or adjusted under 35 U.S.C. 154(b) by 188 days.

(21) Appl. No.: 16/955,168

(22) PCT Filed: Nov. 28, 2018

(86) PCT No.: PCT/EP2018/082886
§ 371 (c)(1),
(2) Date: Jun. 18, 2020

(87) PCT Pub. No.: WO2019/120915
PCT Pub. Date: Jun. 27, 2019

(65) Prior Publication Data
US 2020/0321838 A1 Oct. 8, 2020

(30) Foreign Application Priority Data
Dec. 18, 2017 (FR) .................... 17/62.371

(51) Int. Cl.
*H02K 11/33* (2016.01)
*F01D 25/12* (2006.01)
(Continued)

(52) U.S. Cl.
CPC ............ *H02K 11/33* (2016.01); *F01D 25/12* (2013.01); *F02B 37/10* (2013.01); *F02B 39/005* (2013.01);
(Continued)

(58) Field of Classification Search
CPC .......... F01D 25/12; H02K 11/33; H02K 9/22; H02K 2211/03; F02B 37/10;
(Continued)

(56) References Cited

U.S. PATENT DOCUMENTS 5,235,491 A 8/1993 Weiss
5,491,370 A 2/1996 Schneider et al.
(Continued)

FOREIGN PATENT DOCUMENTS

DE 20016013 U1 12/2001
JP 2011007107 A 1/2011

OTHER PUBLICATIONS

International Search Report for PCT/EP2018/082886, dated Feb. 28, 2019; English translation submitted herewith (7 pgs.).
Office Action dated Oct. 12, 2021 for EP patent application No. 18 807 638.4; 24 pages.

*Primary Examiner* — Igor Kershteyn
(74) *Attorney, Agent, or Firm* — Fitch, Even, Tabin & Flannery LLP

(57) ABSTRACT

The invention is a device (1) for cooling a power electronic system (EP) comprising at least one power electronic component (2) mounted on at least one circuit board (3), the cooling device (1) comprises a hose (4) for circulating a flow (5) at an ambient temperature. The cooling device (1) comprises a first heat exchange surface (6) that is thermally connected to the power electronic components (2) and at least one second heat exchange surface (7). The second heat exchange surface (7) is for heat exchange with the flow (5) circulating through the hose. The second heat exchange surface (7) is fitted inside the circulation hose (4) to remove heat by convection with the circulating flow (5). The second heat exchange surface (7) is thermally connected to the first heat exchange surface (6).

16 Claims, 4 Drawing Sheets

(51) Int. Cl.
  *F02B 37/10* (2006.01)
  *F02B 39/00* (2006.01)
  *H02K 9/22* (2006.01)
  *H05K 7/20* (2006.01)

(52) U.S. Cl.
  CPC ........... *H02K 9/22* (2013.01); *H05K 7/20172* (2013.01); *H05K 7/20272* (2013.01); *H05K 7/20918* (2013.01); *H05K 7/20927* (2013.01); *F05D 2220/40* (2013.01); *F05D 2260/20* (2013.01); *H02K 2211/03* (2013.01)

(58) Field of Classification Search
  CPC .............. F02B 39/005; H05K 7/20172; H05K 7/20272; H05K 7/20918; H05K 7/20927; F05D 2260/20
  See application file for complete search history.

(56) References Cited

U.S. PATENT DOCUMENTS

| | | | |
|---|---|---|---|
| 5,979,540 A | 11/1999 | Allison et al. | |
| 6,930,417 B2 | 8/2005 | Kaneko et al. | |
| 6,933,638 B2 * | 8/2005 | Hirth | H02K 9/06 310/71 |
| 7,295,434 B2 * | 11/2007 | Foulonneau | F04D 29/5813 361/691 |
| 7,719,836 B2 * | 5/2010 | Franz | G06F 1/20 415/213.1 |
| 2002/0170905 A1 | 11/2002 | Peterson et al. | |
| 2003/0226653 A1 | 12/2003 | Takedomi et al. | |
| 2009/0267432 A1 * | 10/2009 | Henry | H02K 5/225 310/71 |
| 2012/0236498 A1 | 9/2012 | Pal et al. | |

\* cited by examiner

FLOW-COOLED POWER ELECTRONICS

CROSS-REFERENCE TO RELATED APPLICATIONS

Reference is made to International Application No. PCT/EP2018/082886, filed Nov. 28, 2018, which claims priority to French Patent application Ser. No. 17/62,371, filed Dec. 18, 2017, the contents of which are incorporated herein by reference in their entirety.

BACKGROUND OF THE INVENTION

Field of the Invention

The present invention relates to the field of power electronic systems, in particular for controlling electric machines for powering supercharger systems used in particular for internal combustion engines. More specifically, the invention relates to a device for cooling these power electronic systems.

Description of the Prior Art

Certain power electronic systems may be DC-to-AC power electronic converters, in particular inverters, the function of which is to interface DC voltage sources with electric machines operating with AC. These inverters make it possible to perform various functions that are essential for conversion and to shape electrical quantities (currents, voltages and frequency) from DC voltage sources. Thus, the functions performed by these inverters are in particular interfacing a voltage source with a load or a source of another nature, controlling the voltages and currents in play, providing good quality of power, whether source-side or load-side, and ensuring the electrical stability of the overall conversion system.

Generally speaking, power electronic systems comprise power electronic components that generate heat in particular due to losses when switching at high frequency. The heat generated may bring the power components to temperatures that are such that the performance of the power components may be negatively affected, and their structures may even be damaged. This is especially so in thermally restrictive environments, such as may be the case when operating close to or on an internal combustion engine under the head of a vehicle.

To overcome these problems of heat management for the electrical components, various solutions have been developed. U.S. Pat. No. 6,930,417 describes an inverter combined with an electric motor in which the power components of the inverter are mounted directly on the electric motor. In this scenario, the power components of the inverter are cooled by a water or liquid cooling circuit.

Document U.S. published patent application Ser. No. 00/549,1370A describes incorporating power electronics as close as possible to an electric machine. The power components are arranged on the edge of the frame of the electric machine. This structure similarly uses a water cooling circuit. Finally, other solutions propose using a fan in order to cool the power electronic components.

These structures of the prior art have several drawbacks such as, in particular, the need for cooling systems that are difficult to design and to incorporate, such as water cooling circuits or fans, or such as the need to use power components which withstand high temperatures when they are arranged in proximity to an internal combustion engine. This entails extra cost for the power electronic systems.

SUMMARY OF THE INVENTION

The present invention therefore aims to overcome the drawbacks presented above and provides a solution for cooling power electronic systems which is simple to design and effective while being incorporated as close as possible to the electric machine to be driven. The invention limits design costs, the costs of electronic components and of using materials for wiring between the components and the machine.

Thus, to achieve at least the objectives given above, among others, the present invention provides, according to a first aspect, a device for cooling a power electronic system comprising at least one power electronic component mounted on at least one circuit board, the cooling device comprising a hose for circulating a flow at an ambient temperature. The cooling device comprises a first heat exchange surface that is thermally connected to the power electronic components and at least one second heat exchange surface for heat exchange with the circulating flow, which second heat exchange surface is fitted inside the circulation hose to remove heat by convection with the circulating flow and the second heat exchange surface is thermally connected to the first heat exchange surface.

A cooling device in accordance with the invention allows the power electronic system to be cooled. This both results in the service life of the electronic system being increased and makes it possible to use inexpensive and compact electronic components that are easy to incorporate on circuit boards. Having a circulation hose which transports a flow at ambient temperature, i.e. at around 20° C., results in it being possible to channel the flow into a restricted space in a given direction, and allows this flow to be brought to a desired location according to the configuration of the hose. Additionally, by choosing a suitable size of hose, at least one of the speed, the pressure and the flow rate of the circulating flow may be controlled, which can be particularly advantageous for removing more or less heat, as will be described below. One advantage of having a first heat exchange surface is that this surface will act as a heat collector. This heat is collected from the electronic components by virtue of at least one of the proximity and the thermal connection thereof or with the heat-generating components. This first thermal surface is generally positioned close to the electronic components so that heat exchange takes place by thermal conduction as quickly and as efficiently as possible.

The advantage of having a second heat exchange surface that is thermally connected to the first heat exchange surface is that it makes it possible for heat to be transferred from the first surface to the second surface, in particular by conduction. These two surfaces may be connected directly or indirectly, as will be described below. Positioning the second heat exchange surface in the flow circulating through the circulation hose results in it being possible for the heat that has built up in and on the second surface to be removed by the flow, in particular by a convection effect. Since the flow is generally cooler than the second heat exchange surface, transfer of heat occurs from the second heat exchange surface to the flow.

According to the invention, the cooling device comprises a heat sink which connects the first heat exchange surface with the second heat exchange surface, and the heat sink at least partly surrounds the flow circulation hose.

The advantage of such a heat sink, the structure of which partly surrounds the hose, is improving the heat exchange both between the first and second heat exchange surfaces and between the second heat exchange surface and the flow. Specifically, having a structure which partially surrounds the hose allows the area of the heat sink to be increased. This area serves in particular to bear the second heat exchange surface and therefore allows the heat exchange area of the second heat exchange surface to be increased.

According to the invention, the second heat exchange surface is borne by fins that are connected to the heat sink and the fins are arranged circularly inside the hose and converge from the wall of the hose towards the center thereof. Designing the second heat exchange surface in the form of fins makes it possible to have a radiator-like device which has a large heat exchange area by virtue of the positioning along the wall of the hose. The arrangement of the fins as stated makes possible using the entire flow circulating through the hose for heat exchange.

According to the invention, the second heat exchange surface is borne by fins that are connected directly to the first heat exchange surface and directed into the circulation hose perpendicular to the first heat exchange surface. Such a structure is straightforward to implement and to construct while ensuring good removal of heat into the flow by virtue in particular of the fins, which act as a radiator.

According to the invention, the second heat exchange surface is borne by fins that are connected directly to the first heat exchange surface and the fins converge inside the hose and towards the center thereof. Such an arrangement of the fins makes it possible to have a structure that is straightforward and quick to implement and which allows heat to be brought to the center of the hose, into the circulating flow, where heat removal is optimal.

According to the invention, the power electronic system is an inverter, some of the power electronic components of which are connected to the first heat exchange surface.

In this way, in an inverter device which produces a lot of heat, the power electronic components, which emit the most heat, will quickly transmit the heat produced to the first heat exchange surface, which will allow faster removal thereof.

According to the invention, the hose for circulating the flow is an air intake hose for an internal combustion engine.

This results in it being possible to use such a system in the area of combustion engines.

According to a second aspect, the invention relates to a power electronic system, comprising a mechanical housing which incorporates at least one circuit board comprising at least one power electronic component, the power electronic system comprising a cooling device such as described above.

The advantage of using such a cooling device in the context of a power electronic system is that it makes it possible to cool the system simply and effectively and to incorporate it within an environment very close to a combustion engine, and to decrease the length of the connections with an electric machine.

According to the invention, the mechanical housing incorporates fins for capturing the heat inside the mechanical housing and transferring it to the flow. These fins may be in addition to the fins of the cooling device, to increase the effectiveness of heat removal further.

According to the invention, the mechanical housing incorporates a fan.

The advantage of such a fan is that it circulates the air inside the housing, accelerating heat exchange with the fins. This fan may be in addition to the fins, and it is sized to be compact and to be able to circulate air.

According to the invention, the mechanical housing comprises a system for circulating a portion of the flow inside the mechanical housing.

The advantage of such a circulation system is that it accelerates heat exchange within the housing and in particular between the power components and the first heat exchange surface.

According to the invention, the power electronic system supplies an electric machine with power. In this way, it is possible to drive an electric machine of a combustion engine with an electronic device which is positioned as close as possible to the electric machine to be driven and which makes it possible to save on wiring and space in particular.

According to the invention, the electric machine drives a compressor. In this way, it is possible to have a supercharger system for a combustion engine which is compact and easy to implement.

According to the invention, the electric machine drives a turbine of a turbocharger.

According to the invention, the airflow flows through the electric machine upstream of the compressor or of the turbine of the turbocharger.

In this way, the flow is at ambient temperature.

According to the invention, the electric machine is arranged on a shaft which connects the compressor of the turbocharger and the turbine of the turbocharger.

BRIEF DESCRIPTION OF THE DRAWINGS

Other features and advantages of the method according to the invention will become apparent upon reading the description below of one non-limiting exemplary embodiment, with reference to the appended figures, which are described below.

DETAILED DESCRIPTION OF THE INVENTION

Figure 1:
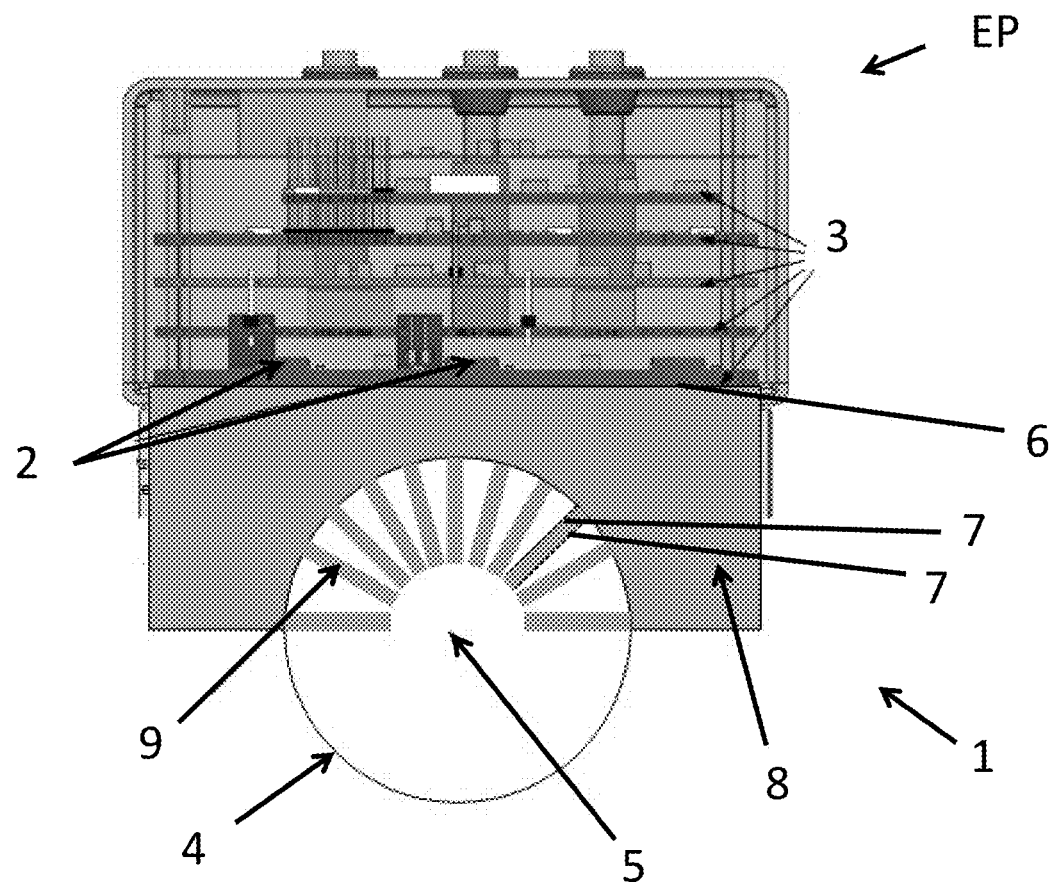
FIG. 1 illustrates a device according to the invention in a first embodiment.

In general, the invention includes power electronics (EP) for powering electric machines (ME) which are located in powertrains comprising an internal combustion engine (M). These electric machines (ME) may be used for example for supercharging internal combustion engines and may be, without limitation, compressors (C) or turbochargers (Tc). These power electronics (EP) may comprise circuit boards (3), as can be seen in FIG. 1, on which electronic components are mounted. In the case that the power electronic system (EP) is an inverter, serving to interface a current source with the various electric machines (ME), the power electronic system (EP) will comprise power electronic components (2). These power electronic components (2) are incorporated on circuit boards (3). The circuit boards (3) are incorporated within a mechanical housing (10). In the context of the invention, the power electronic components (2) are cooled by a flow (5) which circulates through a hose (4) for circulating a flow (5). In the case of an internal combustion engine (M), this hose (4) is an air intake hose (4) for the engine (M). The temperature of the air admitted into this hose (4) is generally close to the temperature of the ambient air (around 20° C. under nominal conditions). Additionally, the flow rate of air admitted into the hose (4) is generally proportional to the power required by the engine (M). The invention uses a cooling device (1) which is coupled to the hose (4) for circulating this flow (5). As can be seen in FIG. 1, which shows a first embodiment of the cooling device (1), the device (1) for cooling the power electronic system (EP) which comprises a first heat exchange surface (6). This first heat exchange surface (6) is the surface where heat transfer between various elements takes place. This first heat exchange surface (6) is connected thermally to the power electronic components (2). Being connected thermally to the power electronic components (2) results in the heat from the power electronic components (2) being collected and transferred by the first heat exchange surface (6) via a temperature gradient. This first heat exchange surface (6) may be positioned on the inner surface of a thermally conductive circuit board. In addition, the cooling device (1) also comprises at least one second heat exchange surface (7), connected thermally to the first heat exchange surface (6), through which the heat will be removed. To this end, the second heat exchange surface (7) is connected thermally to the flow (5) circulating through the hose (4) and for this it is fitted inside the hose (4) for circulating the flow (5) to remove heat by convection with the circulating flow (5). It is from the second heat exchange surface (7) that the heat will be removed into the flow (5). In the context of this first embodiment, an additional part such as a heat sink (8) connects the first and the second heat exchange surfaces. As can be seen in FIG. 1, this heat sink (8) at least partly surrounds the hose (4). The second heat exchange surface (7) is borne by fins (9). It should be understood that the second heat exchange surface (7) is formed by the outer surface of the fins (9). Fins (9) are connected both mechanically and thermally to the heat sink (8) and also thermally to the first heat exchange surface (6) and to the power electronic components (2). Fins (9) may assume various shapes and arrangements. In the first embodiment, the fins (9) are arranged circularly around the hose (4) and they converge from the wall of the hose (4) towards the center thereof. To conduct heat well, the fins (9) and the heat sink (8) are made of a thermally conductive material. The size of the fins (9) may vary in thickness and in length but they are sized to not interfere with the passage of the flow (5) through the hose (4). The fins (9) and the heat sink (8) may be made in one piece.

Figure 2:
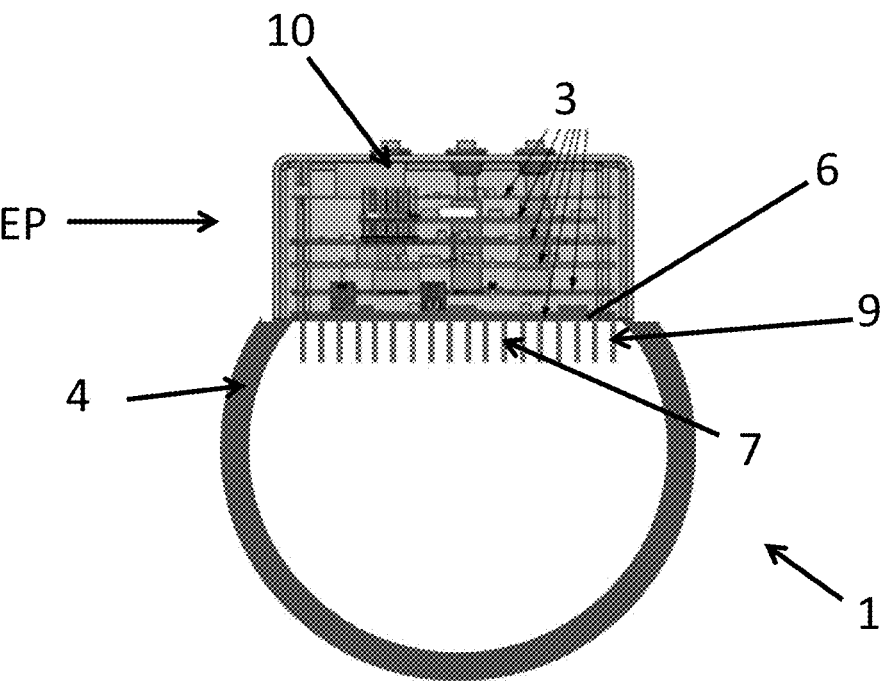
FIG. 2 illustrates a device according to the invention in a second embodiment.

Another embodiment can be seen in FIG. 2, in which the one or more second heat exchange surfaces (7) are borne by fins (9) which are connected directly, that is mechanically and thermally, to the first heat exchange surface (6), limiting conduction through the material. The second heat exchange surface (7) is formed by the outer surface of the fins (9). In this case, the fins (9) are directed into the circulation hose (4), perpendicular to the first heat exchange surface (6). In the same way, the size of the fins (9) may vary in thickness and in length and they are also sized to not interfere with the passage of the flow (5) through the hose (4). The fins (9) are also made of a thermally conductive material.

Figure 3:
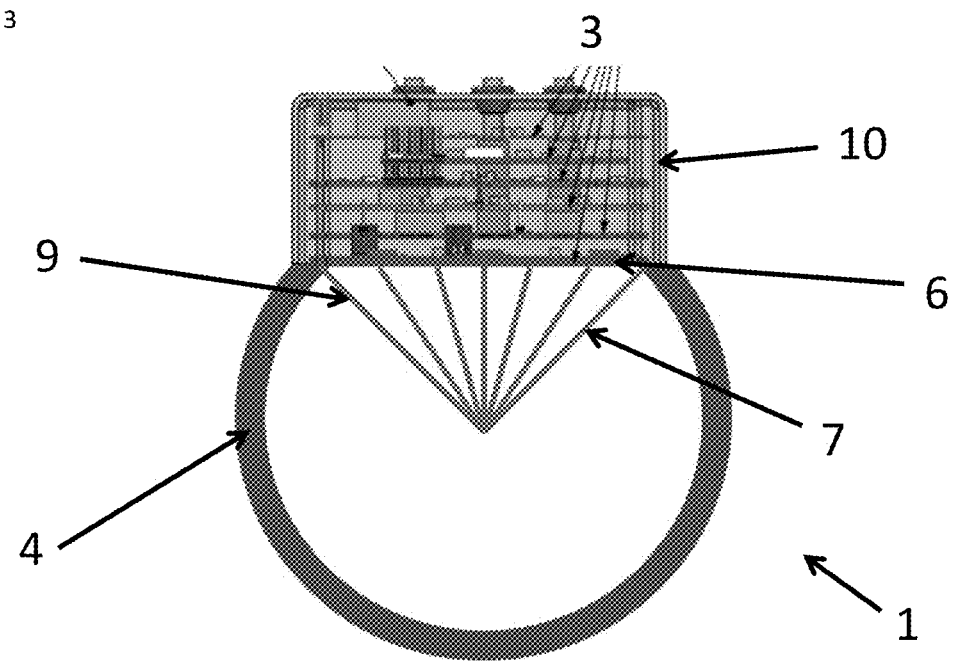
FIG. 3 illustrates a device according to the invention in a third embodiment.

FIG. 3 shows a third embodiment of the cooling device (1) having one or more second heat exchange surfaces (7) borne by fins (9) which are connected directly to the first heat exchange surface (6) and, in this case, the fins (9) converge inside the hose and towards the center thereof.

In these different embodiments, the cooling devices (1) make it possible to use power components (2) which are less expensive since they operate under optimal thermal conditions as they are cooled by a high airflow which ensures optimal thermal management of the inverter housing. In this way, it is possible to decrease the cost of the power electronic system (EP) while ensuring a satisfactory level of performance. In addition, one advantage resides in being able to omit attached cooling devices such as was mentioned previously, which are in particular either dedicated fans (which in addition limits the power consumed by the system) or devices for circulating coolant liquid, such as a water circuit. Such a cooling system additionally makes it possible to be able to incorporate the power electronic system (EP) within an environment very close to the internal combustion engine (M), advantageously resulting in the length of the connections with the electric machine (ME) being decreased and therefore in EMC constraints are reduced.

This invention is particularly satisfactory for the power electronics (EP) of a component powering supercharger members, since it makes it possible a compact and integrated electric machine (ME) with inverter configurations. Specifically, in this particular case, the power electronics (EP) may be positioned as close as possible to an electric machine (ME).

In the three preceding embodiments, the mechanical housing (10) may also incorporate additional fins (not shown). They make possible collection of heat inside the mechanical housing (10) transfer of the heat to the flow (5) circulating through the hose (4).

The mechanical housing (10) may also incorporate a fan (not shown). The purpose of this fan, unlike the dedicated fans mentioned above, is to "mix" the air inside the mechanical housing (10) and thus to promote heat exchange between the additional fins. The mechanical housing (10) may also comprise, in the different embodiments presented above, a system for circulating a portion of the flow (5) inside the mechanical housing (10). This allows the cooling of internal air to be increased.

Figure 4:
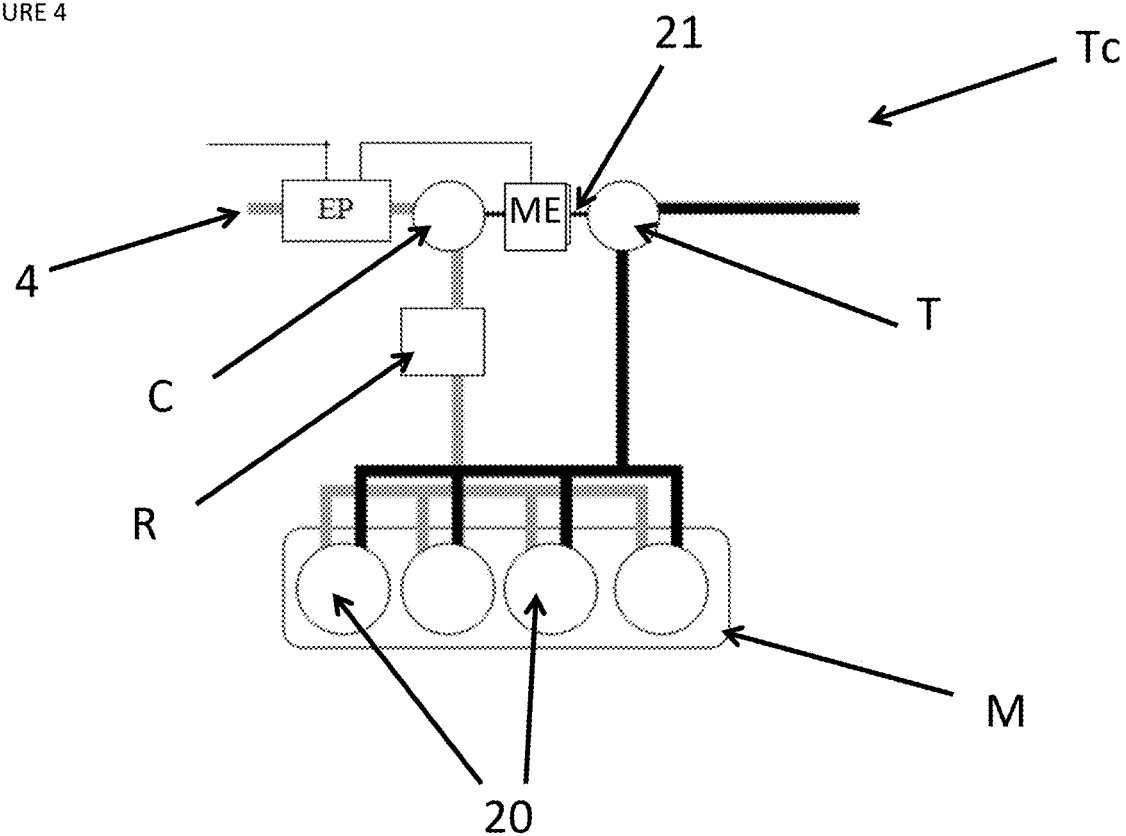
FIG. 4 illustrates a device according to a first configuration in the case of a turbocharger driven by an electric machine.

FIG. 4 shows a turbocharger (Tc) for an internal combustion engine (M) comprising one or more pistons (20). The turbocharger (Tc) comprises a compressor (C) connected by a shaft (21) to a turbine (T), an electric machine (ME), an air intake hose (4) and a supercharger cooler (R). The power electronic system (EP) may be positioned upstream for example of the air compressor (C), where the air temperature is relatively moderate (<50° C.), allowing the length of the cables between the two members to be decreased which increases efficiency and the limitation of EMC losses. For the embodiment illustrated, the electric machine (ME) is placed on the shaft (21) which connects the compressor (C) and the turbine (T) of the turbocharger (Tc).

Figure 5:
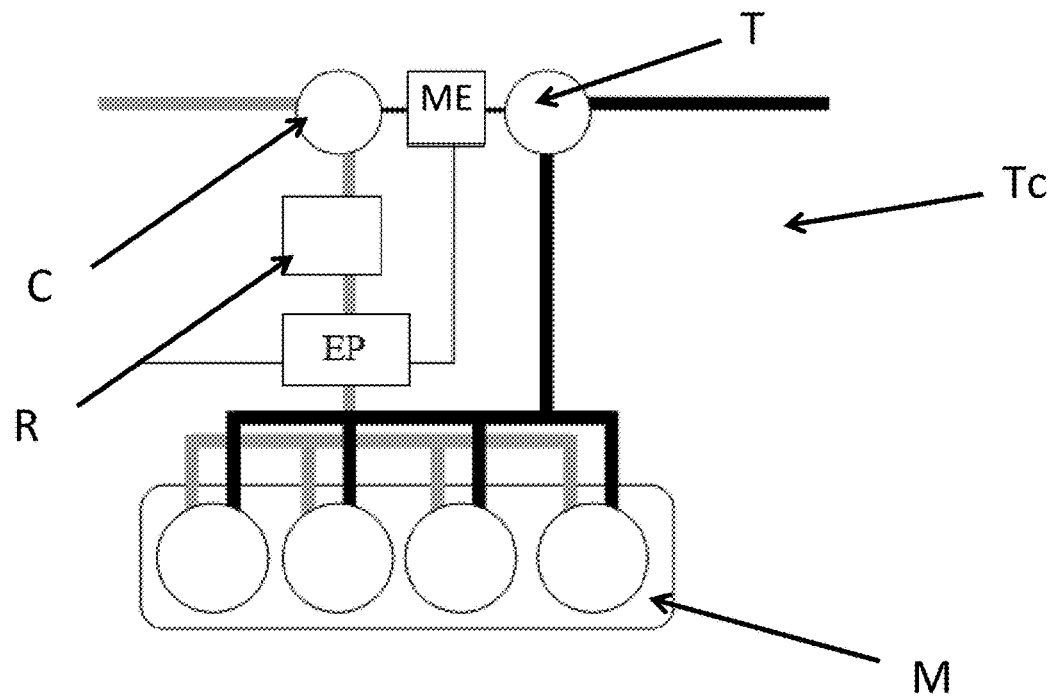
FIG. 5 illustrates a device according to a second configuration in the case of a turbocharger driven by an electric machine.
Figure 6:
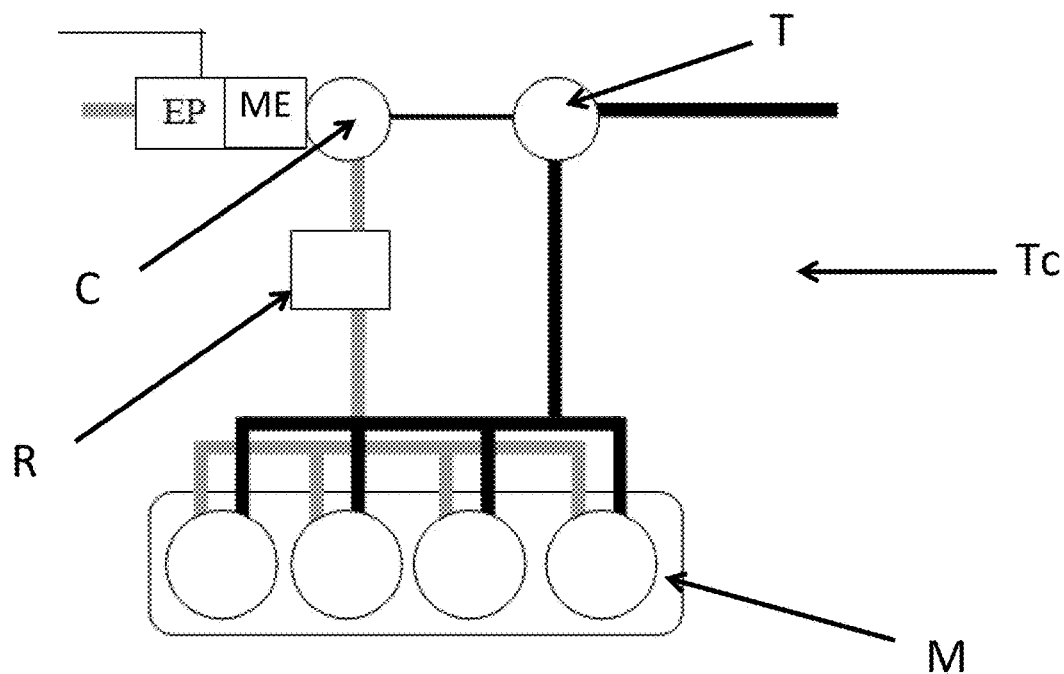
FIG. 6 illustrates a device according to a third configuration in the case of a turbocharger driven by an electric machine.

As can be seen in FIG. 5, which illustrates the same turbocharger (Tc) as in FIG. 4, the power electronics (EP) may also be positioned downstream of the supercharger cooler (R) where the air temperature is controlled to be at a moderate temperature under all operating conditions. For the embodiment illustrated, the electric machine (ME) is placed on the shaft (21) which connects the compressor (C) and the turbine (T) of the turbocharger (Tc). In the case that the electric machine (ME) is positioned on the compressor (C) side, the power electronics (EP) may be incorporated within the electric machine (ME) so as to form just one same component, as can be seen in FIG. 6. This configuration allows the length of the cables between the two members to be decreased to the shortest possible length.

Figure 7:
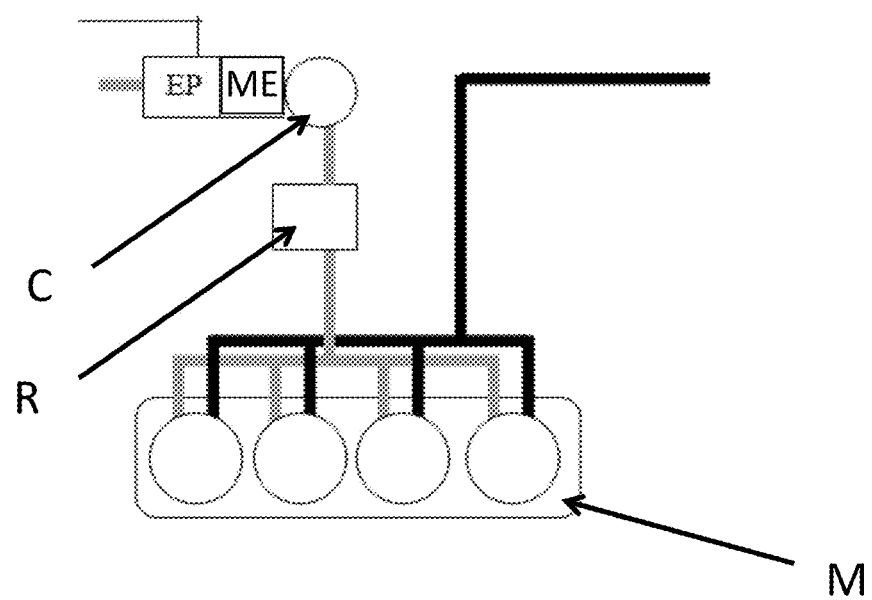
FIG. 7 illustrates an incorporated device in the case of a compressor.

FIG. 7 shows the case of an internal combustion engine (M) with a compressor (C) in which the power electronics (EP) are incorporated within the electric machine (ME) to form a single component. This configuration allows the length of the cables between the two members to be decreased to the shortest possible length.

In all of the cases described, the power electronics solution is connected mechanically to the combustion engine via a system allowing filtration and damping of vibrations from the combustion engine (M).

In the specific case of an electric machine (ME) through which the airflow moves ("air-gap" or "stator-grating" machine), it is even possible to combine the machine and power electronic functions. A saving in terms of space, cooling circuit and overall cost of the system is made.

That the invention is not limited to the above describes embodiments including a cooling device described above by way of example, to encompass all variants.

The invention claimed is:

1. Device (1) for cooling a power electronic system (EP) comprising at least one power electronic component (2) mounted on at least one circuit board (3), said cooling device (1) comprising a hose (4) for circulating a flow (5) at an ambient temperature, characterized in that the cooling device (1) comprises a first heat exchange surface (6) that is thermally connected to the power electronic components (2) and at least one second heat exchange surface (7) for heat exchange with the circulating flow (5), which second heat exchange surface (7) is fitted inside the circulation hose (4) so as to remove heat by convection with the circulating flow (5) and said second heat exchange surface (7) is thermally connected to the first heat exchange surface (6).

2. Cooling device (1) according to claim 1, characterized in that it comprises a heat sink (8) which connects the first heat exchange surface (6) with the second heat exchange surface (7), and the heat sink (8) at least partly surrounds the flow circulation hose (4).

3. Cooling device (1) according to claim 2, characterized in that the second heat exchange surface (7) is borne by fins (9) that are connected to the heat sink (8) and the fins (9) are arranged circularly inside the hose (4) and converge from the wall of the hose (4) towards the centre thereof.

4. Cooling device (1) according to claim 1, characterized in that the second heat exchange surface (7) is borne by fins (9) that are connected directly to the first heat exchange surface (6) and directed into the circulation hose (4) perpendicular to the first heat exchange surface (6).

5. Cooling device (1) according to claim 1, characterized in that the second heat exchange surface (7) is borne by fins (9) that are connected directly to the first heat exchange surface (6) and the fins (9) converge inside the hose (4) and towards the centre thereof.

6. Cooling device (1) according to claim 1, characterized in that the power electronic system (EP) is an inverter, some of the power electronic components (2) of which are connected to the first heat exchange surface (6).

7. Cooling device (1) according to claim 1, characterized in that said hose (4) for circulating the flow (5) is an air intake hose (4) for an internal combustion engine (M).

8. Power electronic system (EP), said system comprising a mechanical housing (10) which incorporates at least one circuit board (3) comprising at least one power electronic component (2), characterized in that said power electronic system (EP) comprises a cooling device (1) according to claim 1.

9. Power electronic system (EP) according to claim 8, characterized in that the mechanical housing (10) incorporates fins for capturing the heat inside the mechanical housing (10) and transferring it to the flow (5).

10. Power electronic system (EP) according to claim 8, characterized in that the mechanical housing (10) incorporates a fan.

11. Power electronic system (EP) according to claim 8, characterized in that the mechanical housing (10) comprises a system for circulating a portion of the flow (5) inside said mechanical housing (10).

12. Power electronic system (EP) according to claim 8, characterized in that it supplies an electric machine (ME) with power.

13. Power electronic system (EP) according to claim 1, characterized in that said electric machine (ME) drives a compressor (C).

14. Power electronic system (EP) according to claim 12, characterized in that said electric machine (ME) drives a turbine (T) of a turbocharger (Tc).

15. Power electronic system (EP) according to claim 13, characterized in that the airflow flows through said electric machine (ME) upstream of said compressor (C) or of said turbine (T) of said turbocharger (Tc).

16. Power electronic system according to claim 13, characterized in that said electric machine (ME) is arranged on a shaft (21) which connects the compressor (C) of said turbocharger (Tc) and the turbine (T) of said turbocharger (Tc).

* * * * *